US011538684B2

(12) United States Patent
Somervell et al.

(10) Patent No.: US 11,538,684 B2
(45) Date of Patent: Dec. 27, 2022

(54) UV-ASSISTED STRIPPING OF HARDENED PHOTORESIST TO CREATE CHEMICAL TEMPLATES FOR DIRECTED SELF-ASSEMBLY

(71) Applicant: Tokyo Electron Limited, Tokyo (JP)

(72) Inventors: Mark H. Somervell, Austin, TX (US); Ian J. Brown, Austin, TX (US); Ihsan Simms, Leuven (BE); Ainhoa Negreira, Leuven (BE); Kathleen Nafus, Leuven (BE)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/671,564

(22) Filed: Nov. 1, 2019

(65) Prior Publication Data
US 2020/0066509 A1 Feb. 27, 2020

Related U.S. Application Data

(62) Division of application No. 14/465,933, filed on Aug. 22, 2014, now Pat. No. 10,490,402.
(Continued)

(51) Int. Cl.
*G03F 7/09* (2006.01)
*H01L 21/027* (2006.01)
(Continued)

(52) U.S. Cl.
CPC ...... *H01L 21/0271* (2013.01); *B81C 1/00031* (2013.01); *G03F 7/0002* (2013.01);
(Continued)

(58) Field of Classification Search
CPC .......... G03F 7/091; G03F 7/094; G03F 7/423; G03F 7/2051
See application file for complete search history.

(56) References Cited

U.S. PATENT DOCUMENTS 5,344,742 A 9/1994 Sinta et al.
5,650,261 A 7/1997 Winkle
(Continued)

FOREIGN PATENT DOCUMENTS

CN 101578232 A 11/2009
CN 101681812 A 3/2010
(Continued)

OTHER PUBLICATIONS

International Search Authority, Search Report and Written Opinion issued in counterpart International Application No. PCT/US14/52292, dated Jan. 22, 2015, 12 pp.
(Continued)

*Primary Examiner* — Daborah Chacko-Davis
(74) *Attorney, Agent, or Firm* — Wood Herron & Evans LLP (57) ABSTRACT

A processing method is disclosed that enables an improved directed self-assembly (DSA) processing scheme by allowing the formation of improved guide strips in the DSA template that may enable the formation of sub-30 nm features on a substrate. The improved guide strips may be formed by improving the selectivity of wet chemical processing between different organic layers or films. In one embodiment, treating the organic layers with one or more wavelengths of ultraviolet light may improve selectivity. The first wavelength of UV light may be less than 200 nm and the second wavelength of UV light may be greater than 200 mn.

14 Claims, 5 Drawing Sheets

Related U.S. Application Data (60) Provisional application No. 61/873,515, filed on Sep. 4, 2013.

(51) Int. Cl.
*H01L 21/311* (2006.01)
*B81C 1/00* (2006.01)
*G03F 7/00* (2006.01)
*G03F 7/42* (2006.01)
*G03F 7/40* (2006.01)

(52) U.S. Cl.
CPC .............. *G03F 7/091* (2013.01); *G03F 7/40* (2013.01); *G03F 7/423* (2013.01); *G03F 7/425* (2013.01); *H01L 21/31133* (2013.01); *H01L 21/31138* (2013.01); *B81C 2201/0149* (2013.01)

(56) References Cited

U.S. PATENT DOCUMENTS

| | | | |
|---|---|---|---|
| 5,709,754 A | 1/1998 | Morinville et al. | |
| 5,830,608 A | 11/1998 | Ishiwata et al. | |
| 6,303,477 B1 | 10/2001 | Ianovitch | |
| 6,312,971 B1 | 11/2001 | Amundson et al. | |
| 6,846,748 B2 | 1/2005 | Chien et al. | |
| 6,855,476 B2 | 2/2005 | Ferreira et al. | |
| 7,521,094 B1 | 4/2009 | Cheng et al. | |
| 7,579,278 B2 | 8/2009 | Sandhu | |
| 7,687,220 B2 | 3/2010 | Yamato et al. | |
| 7,723,009 B2 | 5/2010 | Sandhu et al. | |
| 7,754,518 B2 | 7/2010 | Koelmel et al. | |
| 7,811,940 B2 | 10/2010 | Sandhu | |
| 7,923,373 B2 | 4/2011 | Sandhu | |
| 8,039,196 B2 | 10/2011 | Kim et al. | |
| 8,083,953 B2 | 12/2011 | Millward et al. | |
| 8,241,822 B2 | 8/2012 | Yamato et al. | |
| 8,277,564 B2 | 10/2012 | Le et al. | |
| 8,333,522 B2 | 12/2012 | Arima et al. | |
| 8,420,304 B2 | 4/2013 | Inatomi | |
| 8,603,867 B2 | 12/2013 | Kim et al. | |
| 8,790,522 B1 | 7/2014 | Schmid et al. | |
| 8,853,085 B1 | 10/2014 | Abdallah et al. | |
| 8,900,467 B1 | 12/2014 | Chapuis et al. | |
| 8,980,538 B2 | 3/2015 | Somervell et al. | |
| 8,986,554 B2 | 3/2015 | Kim et al. | |
| 9,005,877 B2 | 4/2015 | Rathsack et al. | |
| 9,034,197 B2 | 5/2015 | Lille et al. | |
| 9,190,288 B2 | 11/2015 | Tanaka et al. | |
| 9,339,312 B2 | 5/2016 | Doherty et al. | |
| 9,412,611 B2 | 8/2016 | Somervell et al. | |
| 9,418,860 B2 | 8/2016 | Somervell et al. | |
| 2002/0192619 A1 | 12/2002 | Besek | |
| 2002/0193619 A1 | 12/2002 | Crivello et al. | |
| 2003/0004075 A1 | 1/2003 | Suto et al. | |
| 2003/0084925 A1 | 5/2003 | Nakajima et al. | |
| 2003/0219682 A1* | 11/2003 | Wakiya ................. G03F 7/091 430/273.1 | |
| 2003/0227090 A1 | 12/2003 | Okabe | |
| 2004/0091820 A1 | 5/2004 | Nagai et al. | |
| 2004/0229050 A1* | 11/2004 | Li ...................... H01L 21/02282 428/447 | |
| 2005/0056219 A1 | 3/2005 | Dip et al. | |
| 2005/0215713 A1 | 9/2005 | Hessell et al. | |
| 2005/0229427 A1 | 10/2005 | Sugimoto et al. | |
| 2006/0123658 A1 | 6/2006 | Izumi | |
| 2006/0251989 A1 | 11/2006 | Breyta et al. | |
| 2007/0037412 A1 | 2/2007 | Dip et al. | |
| 2007/0074747 A1* | 4/2007 | Toshima ................. G03F 7/427 134/201 | |
| 2007/0155132 A1 | 7/2007 | Ancilotti et al. | |
| 2007/0184656 A1 | 8/2007 | Sherman et al. | |
| 2007/0224823 A1 | 9/2007 | Sandhu | |
| 2007/0237697 A1 | 10/2007 | Clark | |
| 2007/0238028 A1 | 10/2007 | Inatomi | |
| 2008/0032490 A1 | 2/2008 | Tuominen et al. | |
| 2008/0193658 A1 | 8/2008 | Millward | |
| 2008/0311402 A1 | 12/2008 | Jung et al. | |
| 2008/0318005 A1 | 12/2008 | Millward | |
| 2009/0081827 A1 | 3/2009 | Yang et al. | |
| 2009/0087664 A1 | 4/2009 | Nealey et al. | |
| 2009/0181171 A1 | 7/2009 | Cheng et al. | |
| 2009/0200646 A1 | 8/2009 | Millward et al. | |
| 2009/0215272 A1 | 8/2009 | Sadjadi et al. | |
| 2009/0236309 A1 | 9/2009 | Millward et al. | |
| 2009/0291398 A1 | 11/2009 | Horiuchi | |
| 2010/0055621 A1 | 3/2010 | Hatakeyama et al. | |
| 2010/0159214 A1 | 6/2010 | Hasegawa et al. | |
| 2010/0178615 A1 | 7/2010 | Colburn et al. | |
| 2010/0193898 A1 | 8/2010 | Hautala et al. | |
| 2010/0200774 A1 | 8/2010 | Burke et al. | |
| 2010/0227276 A1 | 9/2010 | Mizuno | |
| 2010/0279062 A1 | 11/2010 | Millward et al. | |
| 2011/0033786 A1 | 2/2011 | Sandhu | |
| 2011/0039413 A1 | 2/2011 | Akinmade-Yusuff et al. | |
| 2011/0059299 A1 | 3/2011 | Kim et al. | |
| 2011/0147965 A1 | 6/2011 | Mistry et al. | |
| 2011/0147984 A1 | 6/2011 | Cheng et al. | |
| 2011/0147985 A1 | 6/2011 | Cheng et al. | |
| 2011/0151382 A1 | 6/2011 | Kim et al. | |
| 2011/0186544 A1 | 8/2011 | Endou et al. | |
| 2011/0206905 A1 | 8/2011 | Buriak et al. | |
| 2011/0229120 A1 | 9/2011 | Takaki et al. | |
| 2011/0232677 A1 | 9/2011 | Liu et al. | |
| 2011/0272381 A1 | 11/2011 | Millward et al. | |
| 2012/0003587 A1 | 1/2012 | Kim et al. | |
| 2012/0031892 A1 | 2/2012 | Shigetomi et al. | |
| 2012/0046415 A1 | 2/2012 | Millward et al. | |
| 2012/0046421 A1 | 2/2012 | Darling et al. | |
| 2012/0067843 A1 | 3/2012 | Watanabe et al. | |
| 2012/0077127 A1 | 3/2012 | Sills et al. | |
| 2012/0088192 A1 | 4/2012 | Trefonas et al. | |
| 2012/0141741 A1 | 6/2012 | Millward | |
| 2012/0202017 A1 | 8/2012 | Nealey et al. | |
| 2012/0207940 A1 | 8/2012 | Muramatsu et al. | |
| 2012/0223053 A1 | 9/2012 | Millward et al. | |
| 2012/0312501 A1 | 12/2012 | Koole et al. | |
| 2013/0099362 A1 | 4/2013 | Kim et al. | |
| 2013/0143406 A1 | 6/2013 | Hsu et al. | |
| 2013/0183827 A1 | 7/2013 | Millward | |
| 2013/0189504 A1 | 7/2013 | Nealey et al. | |
| 2013/0273330 A1 | 10/2013 | Wang et al. | |
| 2013/0292805 A1 | 11/2013 | Cai et al. | |
| 2013/0344249 A1 | 12/2013 | Minegishi et al. | |
| 2014/0061154 A1 | 3/2014 | Kim et al. | |
| 2014/0065839 A1 | 3/2014 | Kawanishi et al. | |
| 2014/0099583 A1 | 4/2014 | Holmes et al. | |
| 2014/0116980 A1 | 5/2014 | Wuister | |
| 2014/0127910 A1 | 5/2014 | Hieno et al. | |
| 2014/0154630 A1 | 6/2014 | Schmid et al. | |
| 2014/0256145 A1 | 9/2014 | Abdallah et al. | |
| 2014/0287083 A1 | 9/2014 | Gao et al. | |
| 2014/0315390 A1 | 10/2014 | Abdallah et al. | |
| 2015/0021295 A1 | 1/2015 | Yoshikawa et al. | |
| 2015/0108087 A1 | 4/2015 | Somervell et al. | |
| 2015/0111387 A1 | 4/2015 | Somervell et al. | |
| 2015/0126034 A1 | 5/2015 | Latypov et al. | |
| 2015/0191034 A1 | 7/2015 | Millward et al. | |

FOREIGN PATENT DOCUMENTS

| | | |
|---|---|---|
| CN | 102037543 A | 4/2011 |
| CN | 103187245 A | 7/2013 |
| DE | 102012105384 A1 | 9/2012 |
| JP | H10142799 A | 5/1998 |
| JP | H1130711 A | 2/1999 |
| JP | 2002163998 A | 6/2002 |
| JP | 2002265617 A | 9/2002 |
| JP | 2003332313 A | 11/2003 |
| JP | 2004006878 A | 1/2004 |
| JP | 2004172598 A | 6/2004 |
| JP | 2007100191 A | 4/2007 |
| JP | 2007128087 A | 5/2007 |
| JP | 2007279493 A | 10/2007 |

(56) References Cited

FOREIGN PATENT DOCUMENTS

| | | |
|---|---|---|
| JP | 2008036491 A | 2/2008 |
| JP | 2009042760 A | 2/2009 |
| JP | 2009063989 A | 3/2009 |
| JP | 2010505137 A | 2/2010 |
| JP | 2010085977 A | 4/2010 |
| JP | 2010527137 A | 8/2010 |
| JP | 2010531051 A | 9/2010 |
| JP | 2011515537 A | 5/2011 |
| JP | 2011522707 A | 8/2011 |
| JP | 2012038969 A | 2/2012 |
| JP | 2012064783 A | 3/2012 |
| JP | 2013164436 A | 8/2013 |
| KR | 20090009788 A | 1/2009 |
| KR | 20120133272 A | 12/2012 |
| KR | 20130034778 A | 4/2013 |
| WO | 9627212 A1 | 9/1996 |
| WO | 03016209 A1 | 2/2003 |
| WO | 2007127496 A2 | 11/2007 |
| WO | 2008097736 A2 | 8/2008 |
| WO | 2008150673 A1 | 12/2008 |
| WO | 2009100053 A2 | 8/2009 |
| WO | 2009117243 A1 | 9/2009 |
| WO | 2009142869 A2 | 11/2009 |
| WO | 2010042290 A2 | 4/2010 |
| WO | 2011018778 A1 | 2/2011 |
| WO | 2011036778 A1 | 3/2011 |
| WO | 20110140200 A1 | 11/2011 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Taiwan Intellectual Property Office, Notification of Examination Opinion issued in corresponding Taiwan Application No. 103130469 dated May 21, 2015, 9 pp., including English translation.

Taiwan Intellectual Property Office, Notification of Examination Opinion issued in related Taiwan Application No. 103136203 dated Aug. 31, 2015, 11 pp., including English translation.

Cheng et al., "Developing Directly Photodefinable Substrate Guiding Layers for Block Copolymer Directed Self-Assembly (DSA) Patterning," Proc. of SPIE. 7972:79722I(1)-79722I(13), 2011.

Liu et al., "Integration of Block Copolymer Directed Assembly with 193 Immersion Lithography" American Vacuum Society, J. Vac. Sci. Technol. B 28(6), Nov./Dec. 2010, 5 pp.

Bielawski et al., "Regiospecific One-Pot Synthesis of Diaryliodonium Telralluoroborates from Arylboronic Acids and Aryl Iodides," J. Org. Chem. 73:4602-4607, 2008.

Cheng, et al., "EUVL Compatible, LER Solutions using Functional Block Copolymers," Alternative Lithographic Technologies IV, Proc. of SPIE, vol. 8323, 2012, 11 pp.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectrometry," J. Org. Chem. 72:6427-6433, 2007.

Padmanaban et al., "Application of Photodecomposable Base Concept To 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules 5:1331-1371, 2000.

Weissman et al., "Recent advances in ether dealkylation," Tetrahedron. 61:7833-7863, 2005.

Gotrik et al., "Morphology Control in Block Copolymer Films Using Mixed Solvent Vapors," ACS Nano, 6 (9):8052-8059, 2012.

Hammersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in related International Application No. PCT/US2014/016766 dated May 26, 2014, 11 pages.

International Searching Authority, Search Report and Written Opinion issued in related International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in related International Application No. PCT/US2014/026969 dated Jul. 16, 2014, 15 pages.

(56) References Cited

OTHER PUBLICATIONS

International Searching Authority, Search Report and Written Opinion issued in related International Application No. PCT/US2014/027016 dated Jul. 23, 2014, 11 pages.
International Searching Authority, Search Report and Written Opinion issued in related International Application No. PCT/US2014/023926 dated Jul. 25, 2014, 10 pages.
International Searching Authority, Search Report and Written Opinion issued in corresponding International Application No. PCT/US2014/016760 dated Nov. 6, 2014, 11 pages.
Taiwan Patent Office, Examination Opinion issued in related TW Application No. 102117111, dated May 21, 2015, 17 pp.
Taiwan Intellectual Property Office, English translation of Notification of Examination Opinion issued in related Taiwan Application No. 103108241 dated Jun. 12, 2015, 4 pp.
International Searching Authority, Search Report and Written Opinion issued in related International Application No. PCT/US14/61396, dated Jan. 21, 2015, 9 pages.
International Searching Authority, Search Report and Written Opinion issued in related International Application No. PCT/US2014/016760 dated Nov. 6, 2014, 11 pages.
International Searching Authority, Search Report and Written Opinion issued in related International Application No. PCT/US14/61392, dated Jan. 8, 2015, 9 pages.
Taiwan Intellectual Property Office, Notification of Examination Opinion issued in related Taiwan Application No. 103136201 dated Feb. 22, 2016, 11 pp., including English translation.
Taiwan Intellectual Property Office, Notification of Examination Opinion issued in related Taiwan Application No. 103136201 dated Feb. 18, 2016, 11 pp., including English translation.
Taiwan Intellectual Property Office, Notification of Examination Opinions issued in related TW Application No. 10313620, dated Feb. 22, 2016, 11 pp. with English translation.
Taiwan Intellectual Property Office, Rejection Decision issued in related Taiwan Application No. 103136203, dated Feb. 22, 2016, 5 pp. including English translation.
Ross et al., "Templated Self-Assembly of Block Copolymer Films," 2012 Materials Research Society Fall Meeting & Exhibit, Symposium S: Directed Self-Assembly for Nanopatterning, Nov. 25-30, 2012, Boston, Massachussetts, 64 pp.
Vayer et al., "Perpendicular orientation of cylindrical domains upon solvent annealing thin films of polystyrene-b-polylactide", Thin Solid Films 518 3710-3715.
Yu et al., "Self-assembly of polystyrene-poly in deoxycholic acid melt", Polymer, Elsevier Science Publishers B.V, GB, vol. 52, No. 18, Jul. 13, 2011, pp. 3994-4000.
Zhao et al., "Self-reorganization of mixed poly/polystyrene brushes on planar silica substrates in reponse to combined selective solvent treatments and thermal annealing", Polymer 45 7979-7988.
Korean Intellectual Property Office, English translation of Office Action issued in related KR Application No. 10-2016-7013298 dated Sep. 14, 2017, 11 pp.
State Intellectual Property Office of People's Republic of China, English translation of Office Action issued in related CN Application No. 201380031525.5 dated Nov. 13, 2017, 12 pp.
Korean Intellectual Property Office, Office Action issued in related Korean Patent Application No. 10-2016-7013228 dated Jan. 24, 2018, 6 pp. including English translation.
Korean Intellectual Property Office, Office Action issued in related Korean Patent Application No. 10-2016-7013298, dated May 20, 2018, 13 pp.
State Intellectual Property Office of People's Republic of China, Office Action issued in related Chinese Patent Application No. 201380031525.5 dated Jul. 27, 2018, 10 pp. including English Translation.
Japanese Patent Office, Office Action in corresponding Japanese Patent Application No. 2016-540906 dated Jun. 5, 2018.
Korean Patent Office, Office Action in corresponding Korean Patent Application No. 10-2014-7035028 dated Dec. 11, 2018.
Korean Patent Office, Office Action in corresponding Korean Patent Application No. 10-2014-7035028 dated Jun. 3, 2019.
U.S. Patent and Trademark Office, Office Action issued in corresponding U.S. Appl. No. 14/465,933 dated Jan. 11, 2019, 32 pages.
U.S. Patent and Trademark Office, Office Action issued in corresponding U.S. Appl. No. 14/465,933 dated Sep. 30, 2016, 31 pages.
U.S. Patent and Trademark Office, Office Action issued in corresponding U.S. Appl. No. 14/465,933 dated Apr. 7, 2016, 17 pages.
International Search Authority, Search Report and Written Opinion issued in related International Application No. PCT/US14/52292, dated Jan. 22, 2015, 12 pp.
Taiwan Intellectual Property Office, Notification of Examination Opinion issued in related Taiwan Application No. 103130469 dated May 21, 2015, 9 pp., including English translation.
International Bureau of WIPO, International Preliminary Report on Patentability issued for International related Application No. PCT/US2014/052292 dated Mar. 17, 2016, 8 pp.
International Searching Authority, Search Report and Written Opinion issued in corresponding International Application No. PCT/US14/61396, dated Jan. 21, 2015, 9 pages.
International Searching Authority, Search Report and Written Opinion issued in corresponding International Application No. PCT/US14/61392, dated Jan. 8, 2015, 9 pages.
Taiwan Intellectual Property Office, Notification of Examination Opinion issued in corresponding Taiwan Application No. 103136201 dated Feb. 18, 2016, 11 pp., including English translation.
Taiwan Intellectual Property Office, Notification of Examination Opinions issued in counterpart TW Application No. 10313620, dated Feb. 22, 2016, 11 pp. with English translation.
Taiwan Intellectual Property Office, Notification of Examination Opinion issued in corresponding Taiwan Application No. 103136203 dated Aug. 31, 2015, 11 pp., including English translation.
Taiwan Intellectual Property Office, Rejection Decision issued in corresponding Taiwan Application No. 103136203, dated Feb. 22, 2016, 5 pp. including English translation.
Korean Intellectual Property Office, Office Action issued in related Korean Application No. 10-2015-7026370 dated Jul. 15, 2016, 19 pp. including English Translation.
English Translation of Korean Intellectual Property Office, Office Action issued in related Korean Application No. 10-2015-7028220 dated Jul. 15, 2016, 7 pp. (Korean Language document not provided).
Korean Intellectual Property Office, Office Action issued in corresponding Korean Application No. 10-2015-7028220 dated Jul. 15, 2016, 7 pp. including English Translation only.
International Searching Authority, International Search Report and Written Opinion issued in corresponding International Application No. PCT/US13/40815, dated Oct. 21, 2013, 15 pp.
International Searching Authority, Search Report and Written Opinion issued in corresponding International Application No. PCT/US2014/016766 dated May 26, 2014, 11 pages.
International Searching Authority, Search Report and Written Opinion issued in corresponding International Application No. PCT/US2014/016776 dated May 30, 2014, 12 pages.
International Searching Authority, Search Report and Written Opinion issued in corresponding International Application No. PCT/US2014/026969 dated Jul. 16, 2014, 15 pages.
International Searching Authority, Search Report and Written Opinion issued in corresponding International Application No. PCT/US2014/027016 dated Jul. 23, 2014, 11 pages.
International Searching Authority, Search Report and Written Opinion issued in corresponding International Application No. PCT/US2014/023926 dated Jul. 25, 2014, 10 pages.
Taiwan Intellectual Property Office, English translation of Notification of Examination Opinion issued in corresponding Taiwan Application No. 103108241 dated Jun. 12, 2015, 4 pp.
Korean Intellectual Property Office, Office Action issued in corresponding Korean Application No. 10-2015-7026370 dated Jul. 15, 2016, 19 pp. including English Translation.
Korean Intellectual Property Office, Office Action issued in related Korean Application No. 10-2015-7028220 dated Jul. 15, 2016, 7 pp. including English Translation only.

(56) References Cited

OTHER PUBLICATIONS

Japan Patent Office, Official Action issued in related JP Patent Application No. 2016-502295 dated Aug. 23, 2016, 11 pp., including English translation.
Japan Patent Office, Official Action issued in related JP Patent Application No. 2016-500282 dated Sep. 6, 2016, 8 pp., including English translation.
Korean Intellectual Property Office, Office Action issued in related Korean Application No. 10-2015-7026176 dated Dec. 5, 2016, 9 pp. including English translation.
Japan Patent Office, Official Action issued in related JP Patent Application No. 2015-512726 dated Jan. 4, 2017, 14 pp., including English translation.
Japan Patent Office, Office Action issued in related Patent Application No. JP2016-500283 dated Dec. 20, 2016, 19 pp., including English translation.
Japan Patent Office, Office Action issued in counterpart JP Patent Application No. 2016-549215 dated Feb. 28, 2017, 6 pp., including English translation.
U.S. Patent and Trademark Office, Non-final Office Action issued in related U.S. Appl. No. 15/161,762 dated Dec. 15, 2016, 34 pp.
Japan Patent Office, Final Office Action issued in related JP Patent Application No. 2016-500283 dated Mar. 28, 2017, 9 pp., including English translation.
Korean Intellectual Property Office, Office Action issued in related KR Patent Application No. 10-2016-7013228 dated Jul. 12, 2017, 12 pp., including English translation.
Cheng et al., "Simple and Versatile Methods To Integrate Directed Self-Assembly with Optical Lithography Using a Polarity-Switched Photoresist," ACS Nano, 4:4815-4823, 2010.
Choi et al., "Square Arrays of Holes and Dots Patterned from a Linear ABC Triblock Terpolymer," ACS Nano, 6:8342-8348, 2012.
Foubert et al., "Impact of post-litho LWR smoothing processes on the post-etch patterning result," Proc. of SPIE, 7972:797213-797213, 2011.
Jung et al., "Orientation-Controlled Self-Assembled Nanolithography Using a Polystyrene-Polydimethylsiloxane Block Copolymer," Nano Lett. 7:2046-2050, 2007.
Postnikov et al., "Study of resolution limits due to intrinsic bias in chemically amplified photoresists," J. Vac. Sci. Technol. B. 17:3335-3338, 1999.
Rathsack et al., "Pattern Scaling with Directed Self Assembly Through Lithography and Etch Process Integrations," Proc. of SPIE 8323, Alternative Lithographic Technologies IV, 83230B ; doi:10.1117/12.916311, 14 pp.
Ross et al., "Si-containing block copolymers for self-assembled nanolithography," J. Vac. Sci. Technol. B. 26:2489-2494, 2008.
Korean Patent Office, Office Action issued in KR 10-2016-7008478 dated Nov. 30, 2020.
Korean Patent Office, Office Action issued in KR 10-2016-7008478 dated Aug. 30, 2021.

* cited by examiner

UV-ASSISTED STRIPPING OF HARDENED PHOTORESIST TO CREATE CHEMICAL TEMPLATES FOR DIRECTED SELF-ASSEMBLY

CROSS REFERENCE TO RELATED APPLICATION

Pursuant to 37 C.F.R. § 1.78(a)(4), this application claims the benefit of and priority to prior filed co-pending U.S. Utility patent application Ser. No. 14/465,933 filed Aug. 22, 2014, and to Provisional Application Ser. No. 61/873,515 filed Sep. 4, 2013.

FIELD OF THE INVENTION

This invention relates to semiconductor processing technology, and more particularly, to methods for directed self-assembly of block copolymers (BCP) on a substrate.

BACKGROUND OF THE INVENTION

Photolithography is a semiconductor manufacturing technique that may be used to generate patterns on the substrate that may be used to form the integrated circuits or electronics devices. Cost and performance improvements in semiconductor devices may be accomplished by increasing device density on a substrate. One approach to achieve higher device density may be to increase miniaturization of features being formed on a semiconductor substrate. Accordingly, new methods or techniques to generate smaller patterns would be desirable.

Self-assembly of block copolymers (BCP) have been used as a tool for decreasing patterned feature sizes using standard photolithography techniques. BCPs may be useful in semiconductor manufacturing because they may form ordered, chemically distinct templates with dimensions of less than 30 nm. The geometry of the template may be manipulated by the molecular weight and composition of the different block types of the copolymer. The template may comprise two or more areas of differing chemical activity that periodically alternate. In one approach, one of the areas of chemical activity may be attractive to one of the block copolymer phases, while the other area of chemical activity may be neutral to both blocks of the BCP. In one instance, the attractive area may force the BCP to align above it, and then the alternate BCP may be forced to align next to this pinned phase. In this way, the block copolymer can be directed to self-assemble in parallel to the pinning guides over large areas of the substrate.

The template may be formed using different organic materials that may be patterned with organic photoresist. In this instance, the patterning process may need to include a removal process or method that increases the selectivity between the exposed and unexposed organic materials on the substrate.

SUMMARY

This disclosure relates to a directed self-assembly template manufacturing process that incorporates the deposition, patterning, and removal of organic materials to form a patterning template for sub-30 nm structures. More particularly, in one specific embodiment, the template may be formed by patterning and etching a polystyrene layer deposited on a substrate. An organic photoresist may be deposited on the polystyrene layer and the patterning/etch process may result in a residual organic polymer being formed on a sidewall of the polystyrene layer that may not be covered by the photoresist. Ideally, the removal of the photoresist and the residual polymer may be done using the same process or chemistry.

In one embodiment, the template may be formed by depositing a polymer (e.g., polystyrene) on a substrate used to manufacture semiconductor devices. The polymer may be heated to a bake temperature (e.g., <310 C) for a period of time that may increase the density of the polymer and may cross-link the polymer. A photoresist layer may be deposited on the polymer and patterned to expose the underlying polymer. A portion of the polymer that is not covered by the photoresist may be removed using a dry or wet etch process. In certain instances, the etch process may deposit a residual polymer on a sidewall of the polymer not covered by the photoresist and the photoresist. However, the presence of the residual polymer may not be desired with the formation of the template. Accordingly, the removal of the photoresist and the residual polymer using the least amount of process steps may be desirable. For example, oxygen and ultra-violet (UV) light may be used to oxidize a portion of the photoresist and/or change the surface state of the residual polymer, such that the photoresist and residual polymer may be removed with minimal impact to the geometry and/or surface properties of the underlying polymer. The UV light may include a first wavelength and a second wavelength, such that the first wavelength is greater than 200 nm and the second wavelength is less than 200 nm. The UV light may have a dose between 0.01 J/cm2 to 150 J/cm2. In another embodiment, at least 10% of the UV light exposed to the substrate may have a wavelength less than 200 nm. In one specific embodiment, the first wavelength being 185 nm and the second wavelength being 254 nm.

Following the UV light exposure, a wet chemical etch may be done using a variety of chemistries, which may include, but is not limited to a combination of deionized water, ammonium hydroxide, and hydrogen peroxide or tetramethylammonium hydroxide and dimethyl sulfoxide or a combination thereof. The clean chemistry may need to demonstrate selectivity between the polymer, residual polymer, and the photoresist.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N > 10.5$) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductor material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self-assemble into ordered morphologies, having spherical, cylindrical, lamellar, bicontinuous gyroid, or miktoarm star microdomains, where the molecular weight of the block copolymer dictates the sizes of the microdomains formed.

The domain size or pitch period ($L_0$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "baking" or "bake" as used herein means and includes treatment of the block copolymer so as to enable sufficient microphase segregation between the two or more different polymeric block components of the block copolymer to form an ordered pattern defined by repeating structural units formed from the polymer blocks. Baking of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. application Ser. No. 13/830,859, CHEMI-EPITAXY IN DIRECTED SELF-ASSEMBLY APPLICATIONS USING PHOTO-DECOMPOSABLE AGENTS, by Somervell, et al., filed on Mar. 14, 2013.

Figure 1A:
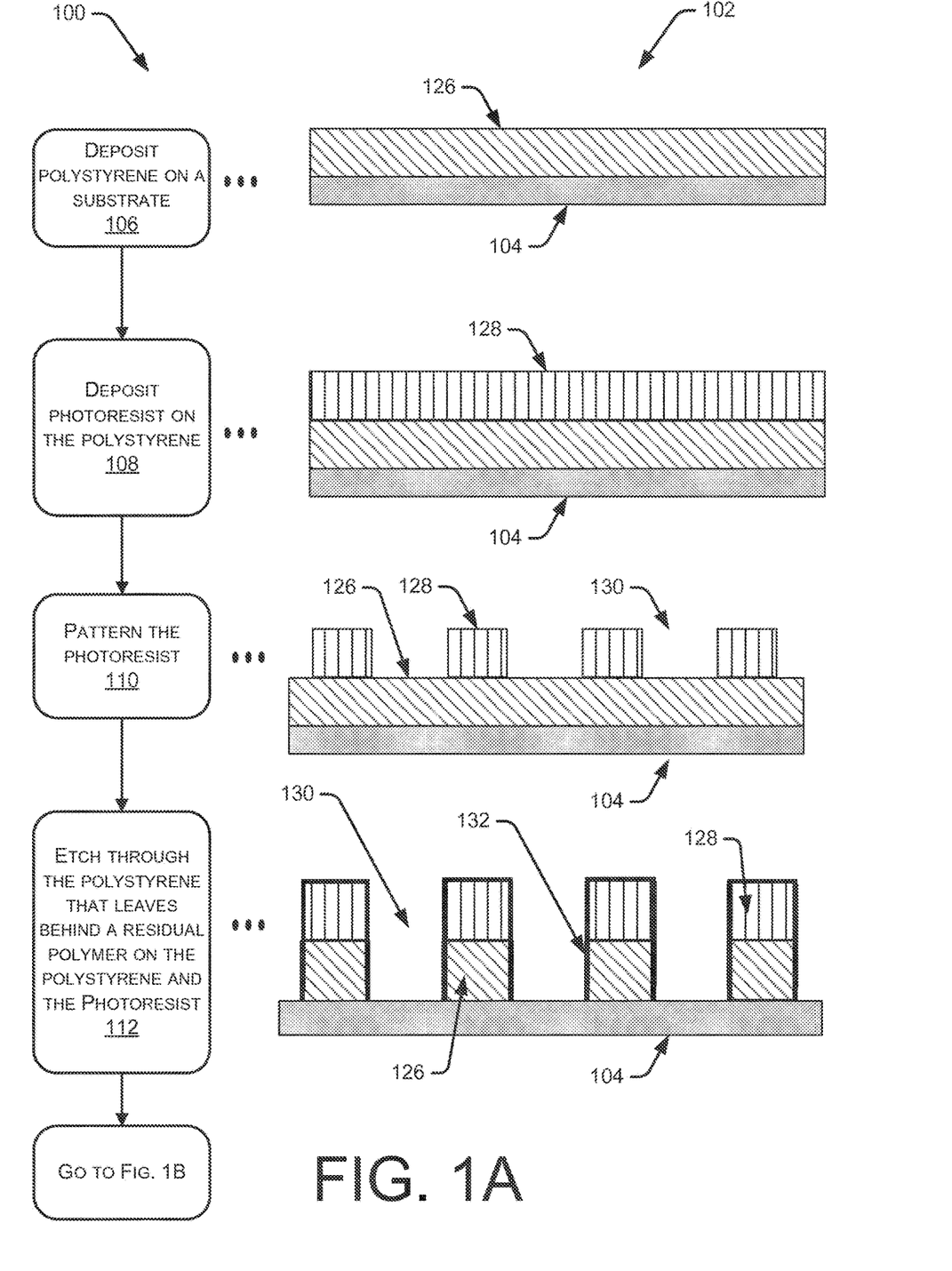
FIGS. 1A-1C include an illustration of a flow diagram with corresponding illustrations for a method to generate at least a portion of a directed self-assembly template used to manufacture a semiconductor device on a substrate.
Figure 1B:
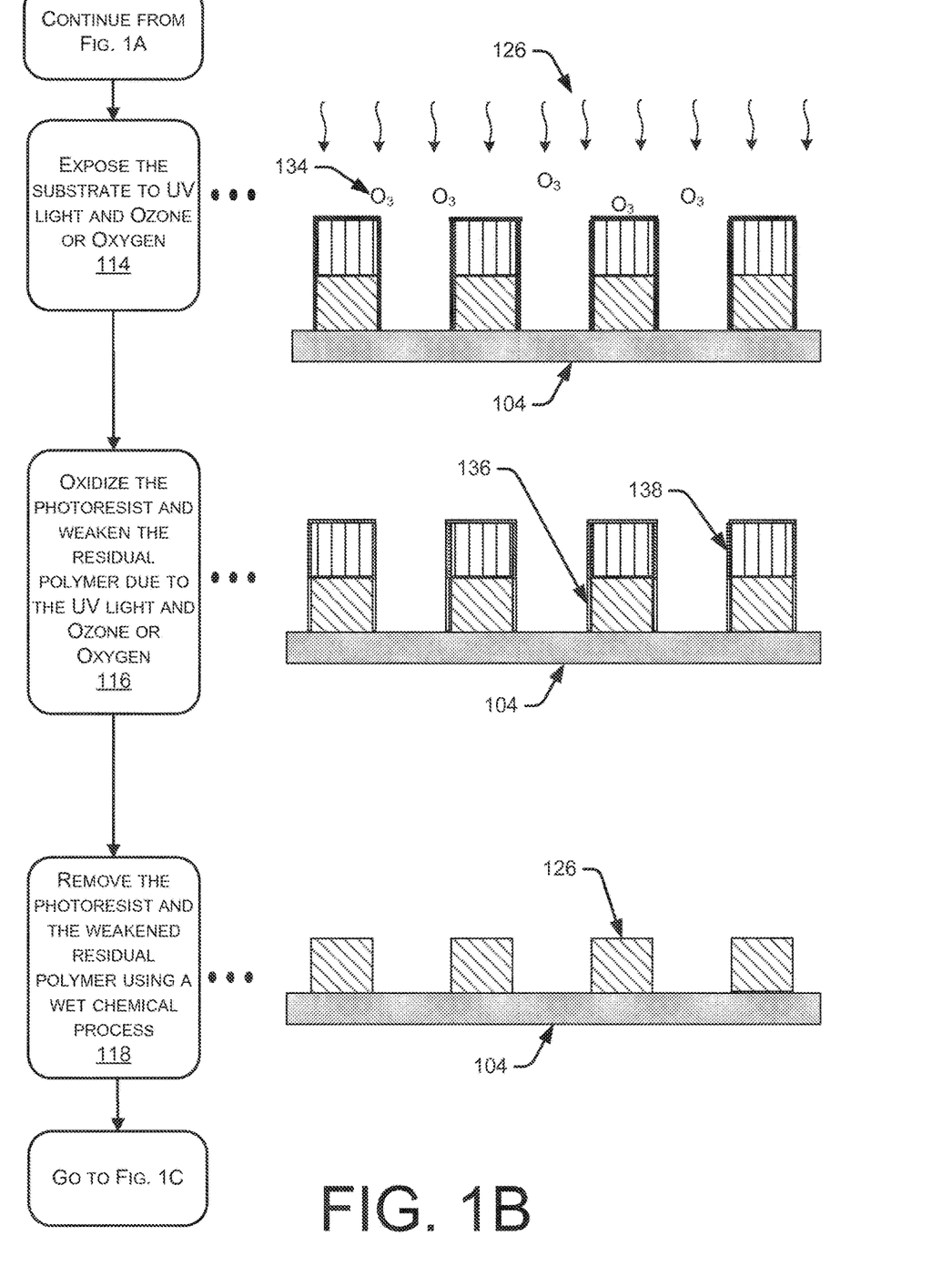

FIGS. 1A-1B include a flow diagram 100 for a method to generate a directed self-assembly (DSA) template to be used to etch sub-30 nm features into a substrate 104 and corresponding cross-section illustrations 102 to illustrate the method 100. The DSA template may be used to achieve uniform and small scale patterns (e.g., <30 nm) on the substrate 104. In one embodiment, the self-assembly of BCPs based on the surface properties of DSA template may include two or more areas with different surface properties that may alternate throughout the DSA template. One approach to forming the DSA template may include forming a guide material on the substrate 104 that may include narrow lines with a width of less than 20 nm that form a pattern on the substrate 104. The guide material (e.g., organic polymer 126) may be formed by patterning with an organic photoresist deposited on the unpatterned guide material. The patterning of the guide material may include the removal of a portion of the guide material using an etch process that may deposit a residual polymer on a sidewall of the guide material. Ideally, the organic photoresist can be removed from the organic guide material without impacting the geometry or surface properties that would negatively impact subsequent processing. Accordingly, a selective removal scheme that enables the selective removal of the organic photoresist and the residual polymer, but maintaining the surface properties and geometry of the polymer may be desirable. For example, the geometry or profile of the polymer may form a substantially square or rectangular shape with uniform surfaces and the bonds at the surface are strong enough to maintain that profile during subsequent processing of the substrate 104.

Although the method 100 will be described as multiple discrete options for the purposes of explanation. However, the order of description should not be construed as to imply that these operations are necessarily order dependent. In particular, these operations may not need to be performed in the order of presentation. The method 100 may be performed in a different order that the described embodiment. Further, some of the operations may also be omitted or may have additional operations performed in order to form the DSA template.

At block 106, an organic polymer 126 may be deposited on the substrate 104 to form the foundation for the DSA template. The organic polymer 126 may include, but is not limited to, polystyrene that may be cross linked when baked at above room temperature. The cross linking may increase the strength of the organic polymer 126 to resist structural changes caused by subsequent processing of the substrate 104. For example, the cross linked organic polymer 126 may be less likely to be removed or deformed by subsequent layer deposition, patterning, and/or cleaning of the substrate 104. In one embodiment, the baking of the organic polymer 126 may increase density of the organic polymer 126 by using a bake temperature between 200 C and 310 C.

The deposited organic polymer 126 may be deposited in a relatively uniform thickness that may be continuous across a surface of the substrate 104. However, the DSA template may be implemented using discrete portions of the organic polymer 126 to enable sub-30 nm features on the substrate 104. Accordingly, the organic polymer 126 may be patterned using photolithography techniques.

At block 108, a photoresist layer 128 may be deposited on the organic layer 126 in a uniform and/or conformal manner. The photoresist layer 128 may be any radiation sensitive composition that chemically reacts when exposed to visible light, deep ultraviolet (DUV) light, extreme ultraviolet (EUV) light, electron beam and X-ray radiant energy are radiation types commonly used today in photolithography processes. When exposed to radiation, the bonds of the molecules in the photoresist layer 128 may break or become more soluble, such that the exposed portion may be dissolved using a photoresist developer chemical. The photoresist layer 128 may be a positive tone photoresist. A positive tone photoresist may become more soluble when exposed to radiation and a negative tone photoresist may become less soluble when exposed to radiation. In one embodiment, the positive tone photoresist or the negative tone photoresist may include, but is not limited to, one or more of the following: protected or unprotected methacrylic copolymers, protected or unprotected acrylic comonomers, styrene, hyrdoxystyrene, or protected or unprotected hyrdoxystyrene comonomers. The exposure of radiation may be controlled by a patterning process that may expose discrete portions of the photoresist layer 128 to radiation using known photolithography equipment and techniques. In another embodiment, the photoresist layer 128 may a negative tone photoresist that may become less soluble in a different type of developer than the positive tone photoresist, such that the exposed portion of the negative tone photoresist layer remains intact, while the unexposed portion may be removed.

At block 110, the photoresist layer 128 may be patterned by exposing discrete portions of radiation (e.g., light) to make those exposed regions, in one embodiment, more soluble or more easily removed to expose portions of the organic polymer layer 126. The exposed portions 130 of the organic polymer 126 may be exposed to subsequent processing like etching or cleaning. The DSA template pattern may include straight lines that form a substantially square or rectangular cross section profile of the photoresist layer 128, as shown in FIG. 1A. The exposed portions 130 of the organic polymer 126 are opposite from the portions of the photoresist layer 128 that may be have been removed during a chemical and/or plasma processing that are not shown the flow diagram for method 100 in FIGS. 1A-1B.

At block 112, a chemical process may be used to remove or etch the exposed portions 130 of the organic polymer 126 in a manner that transfers the pattern of the photoresist layer 128 to the organic polymer 126. The chemical process may include, but is not limited to, a gas that generates a residual polymer 132 on at least one sidewall of the organic polymer 126 and the photoresist layer 128 during the removal process. For example, as the organic polymer 126 is removed using the gas (e.g., CF4), a passivating polymer (e.g., residual polymer 132) may be formed as a by-product of the removal process. Unfortunately, the residual polymer 132 may interfere with the implementation of the DSA template to form sub-30 nm features in the substrate 104. For example, the organic polymer 126 and the photoresist layer 128 may be trimmed (not shown) to a thinner width to create a DSA template that can enable smaller features than the patterns provided in previous patterning process (e.g., block 110). The trimming may include additional patterning and etching of both layers that narrows the width of the organic polymer 126. The residual polymer 132 may interfere with the trimming process. Accordingly, the residual polymer 132 may be removed to improve the performance or capability of the DSA techniques. The etching of the photoresist layer 128 may result in a hardening of the exposed surface, such that the hardened portion may be more chemically resistant than the unexposed portions of the photoresist layer 128. For example, the exposed portion (e.g., residual polymer 132) of the photoresist layer 128 may be more densified than unexposed portions, such that the photoresist layer 128 may be more difficult to remove using plasma etch processing or wet chemical etch processing. Therefore, it may be desirable to treat the residual polymer 132 to make them easier to remove. The treatment may include the same or similar UV treatment steps described below.

At block 114 in FIG. 1B, the substrate 104 may be exposed to ultra-violet (UV) light 126 to improve the selectivity of any chemistry that may be used to remove the residual polymer 132 from the organic polymer 126 and the photoresist layer 128. The UV light 126 may include electromagnetic radiation that has a wavelength of at least 100 nm. In one embodiment, the UV light 126 may include one or more wavelengths of electromagnetic radiation that may be exposed to the substrate at the same time or in a sequential manner. In one embodiment, a single wavelength of UV light 126 may be used to the treat the substrate 104. The UV light 126 can make the photoresist layer 128 and residual layer 126 more amenable to removal through a variety of mechanisms.

In another embodiment, two different wavelengths of UV light 126 may be used to treat the substrate 104. The first wavelength of light may be less than 200 nm and the second wavelength of light may be greater than 200 nm. The UV light 126 may have a dose of up to 150 J/cm2. In another embodiment, the first wavelength of UV light 126 may about 185 nm and the second wavelength of UV light 126 may be about 254 nm.

In another embodiment, the distribution of UV light 126 wavelength may also vary during the exposure process in block 114. For example, the UV light 126 may include at least 10% of the first wavelength with the remainder including UV light 126 of the second wavelength. In one specific embodiment, at least 10% of the UV light 126 may include a wavelength of about 185 nm with the remainder of the UV light 126 having a wavelength of about 254 nm.

In addition to the UV light 126, the exposure process may also include a reactive gas 134 that may weaken the residual layer 132 and the exposed surface of the photoresist layer 128 and make both layers more susceptible to removal (e.g., improved selectivity). The reactive gas may include, but is not limited to, monoatomic oxygen, diatomic oxygen, and/or ozone.

At block 116, the combination of the UV light 126 and the reactive gas 134 may oxidize and/or weaken the residual polymer layer 136 and a surface 138 of the photoresist layer 128. The reactive gas 134 may include diatomic oxygen that may be used to generate ozone when the reactive gas 134 is exposed to the UV light 126 or any other energy source. At a minimum, the combination of the UV light 126 and/or the reactive gas 134 may be used to change a surface state of the residual polymer 136. For example, the residual polymer 136 and/or the weakened photoresist layer 138 may be highly absorbent to at least a portion of the UV light 126 and induces the excitation of electrons that can facilitate the breaking of bonds in the weakened residual polymer 136 and/or the weakened surfaces 138 of the photoresist layer 128. In one embodiment, the photoresist layer 128 may be more highly absorbent to the 185 nm wavelength UV light 126 and may be more likely to break the bonds in the photoresist layer 128. On the other hand, the 254 nm UV light 126 may not be as absorbent to the underlying layers, but there may be a much higher fluence of 254 nm photons with enough energy to break the bonds in the underlying layers. The higher UV light 126 wavelength may be more likely to break the carbon chain in the underlying layers than the UV light 126 with a lower wavelength.

The reactive gas 134 may also make the weakened residual polymer 136 more hydrophilic, such that the weakened residual polymer 136 may be more easily removed in a subsequent wet chemical process.

At block 118, a wet chemical process may be used to remove the photoresist layer 128 and the weakened residual polymer 136 to expose the organic polymer 126. In one embodiment, the wet chemical process may include one or more steps that may include one or more of the following chemicals: ammonium hydroxide, hydrogen peroxide, water, an aqueous, semi-aqueous, non-aqueous chemical solution, or any combination thereof. Accordingly, the organic polymer 126 may form a pattern on the substrate 104 following the removal of the photoresist layer 128 and the residual polymer 136, 138. In one instance, the pattern may include parallel or substantially parallel lines of the organic polymer 126 across the substrate 104.

In one embodiment, the wet chemical process may include a combination of ammonium hydroxide, hydrogen peroxide, and water in a ratio of 1:1:5 with 27%, by weight, of ammonium hydroxide and 30% of hydrogen peroxide. In one instance, the temperature of that aforementioned combination may be 50° C. and the substrate 104 may be exposed to the combination for up to two minutes.

In another embodiment, the wet chemical process may include, but is not limited to, a one or more of the following chemicals: tetramethylammonium, N-Methylpyrrolidone and/or dimethyl sulfoxide. The aforementioned wet chemical combination may be heated between 45°-65° C. and exposed to the substrate 104 for up to two minutes. In one specific embodiment, the substrate 104 exposure time may be one minute.

At block 120, a neutral copolymer layer 140 may be deposited on the substrate 104 and may cover the organic layer 126 and spaces between portions of the organic layer 126. In one embodiment, the neutral copolymer layer may be grafted to the substrate 104 and not the organic layer 126. The grafting process may include a baking step that is less than 300° C. Generally, the neutral copolymer layer 140 may not have a chemical affinity to the organic layer 126 or subsequent BCP layer (not shown) deposited on the substrate 104. The neutral copolymer layer 140 may include, but is not limited to, non-aligned copolymer blocks.

Figure 1C:
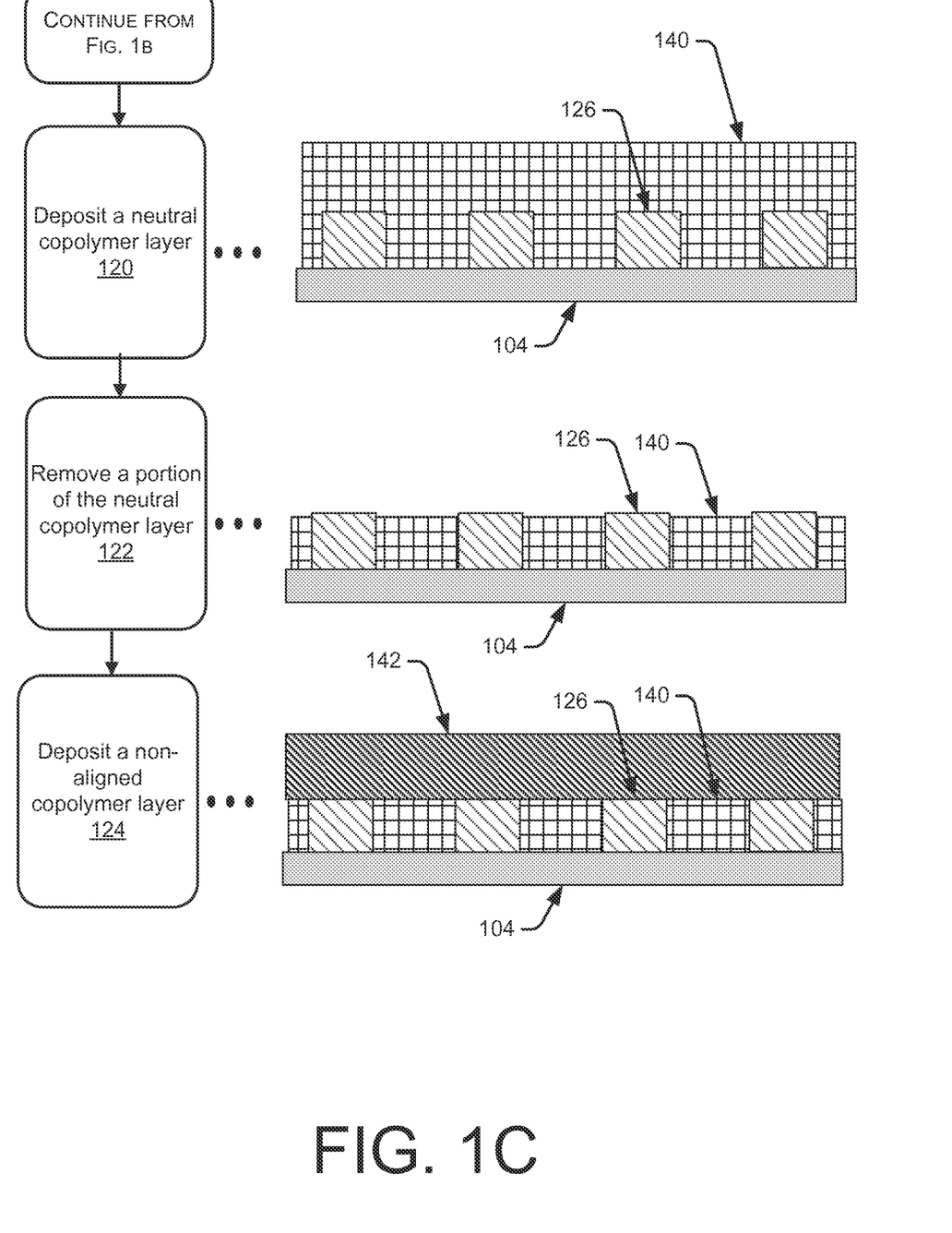

At block 122, non-grafted portions of the neutral copolymer layer 140 may be removed from the substrate 104 using a rinse or chemical process that minimizes the step height difference between the organic layer 126 and the neutral copolymer layer 140, as shown in FIG. 1C. The step height being the difference in thickness between the substrate 104 and the opposing surface of the organic layer 126 and the neutral copolymer layer 140. For example, the surfaces of the organic layer 126 and the neutral copolymer layer 140 that are opposite the substrate 104 may be flush or substantially flush with each other, such that the step height difference is minimal.

At block 124, a non-aligned or random copolymer layer 142 may be deposited over the neutral copolymer layer 140 and the organic polymer 126. The random copolymer layer 142 may include at least two polymer blocks that can self-organize or self-assemble in a predictable manner during subsequent processing of the substrate 104. For example, the polymer blocks may be immiscible and may segregate under appropriate conditions to form domains (not shown) predominantly containing a single block species or an alternating pattern of each species. The random copolymer layer 142 may be deposited by various methods, including, but not limited to, spin-on coating, spin casting, brush coating, or vapor deposition. For example, the random copolymer layer 142 may be provided as a solution in a carrier solvent such as an organic solvent, e.g., toluene. The solution may be applied to the substrate 104 and the neutral copolymer layer 140 and the carrier solvent may be subsequently removed to provide the random copolymer layer 142. The random copolymer layer 142 may include, but is not limited to, two or more species of polymers that may include polystyrene and polymethylacrylate (PMMA).

It will be appreciated that the different species are understood to self-aggregate due to thermodynamic considerations in a process similar to the phase separation of materials. The self-organization is guided by the physical interfaces organic layer 126 and the neutral copolymer layer 140, as well as the chemical affinities for each other. Accordingly, the constituent blocks of the block copolymers can orient themselves along the length of the patterned portions of the substrate 104. The self-organization may be facilitated and accelerated by annealing the layered structure illustrated adjacent to block 124. The temperature of the annealing process may be chosen to be sufficiently low to prevent adversely affecting the block copolymers or the layered structure. The anneal may be performed at a temperature of less than about 350° C., less than about 300° C., less than about 250° C., less than about 200° C. or about 180° C. in some embodiments. According to another embodiment, the annealing process may include a solvent anneal, which generally reduces the annealing temperature.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 260° C. to about 350° C., wherein the low oxygen atmosphere comprises less than about 40 ppm oxygen. For example, the layer of the block copolymer 380 may be exposed to annealing conditions of 310° C. in a low oxygen environment (e.g., no more than 300 ppm) for about a 2 minutes to about 5 minutes.

Figure 2:
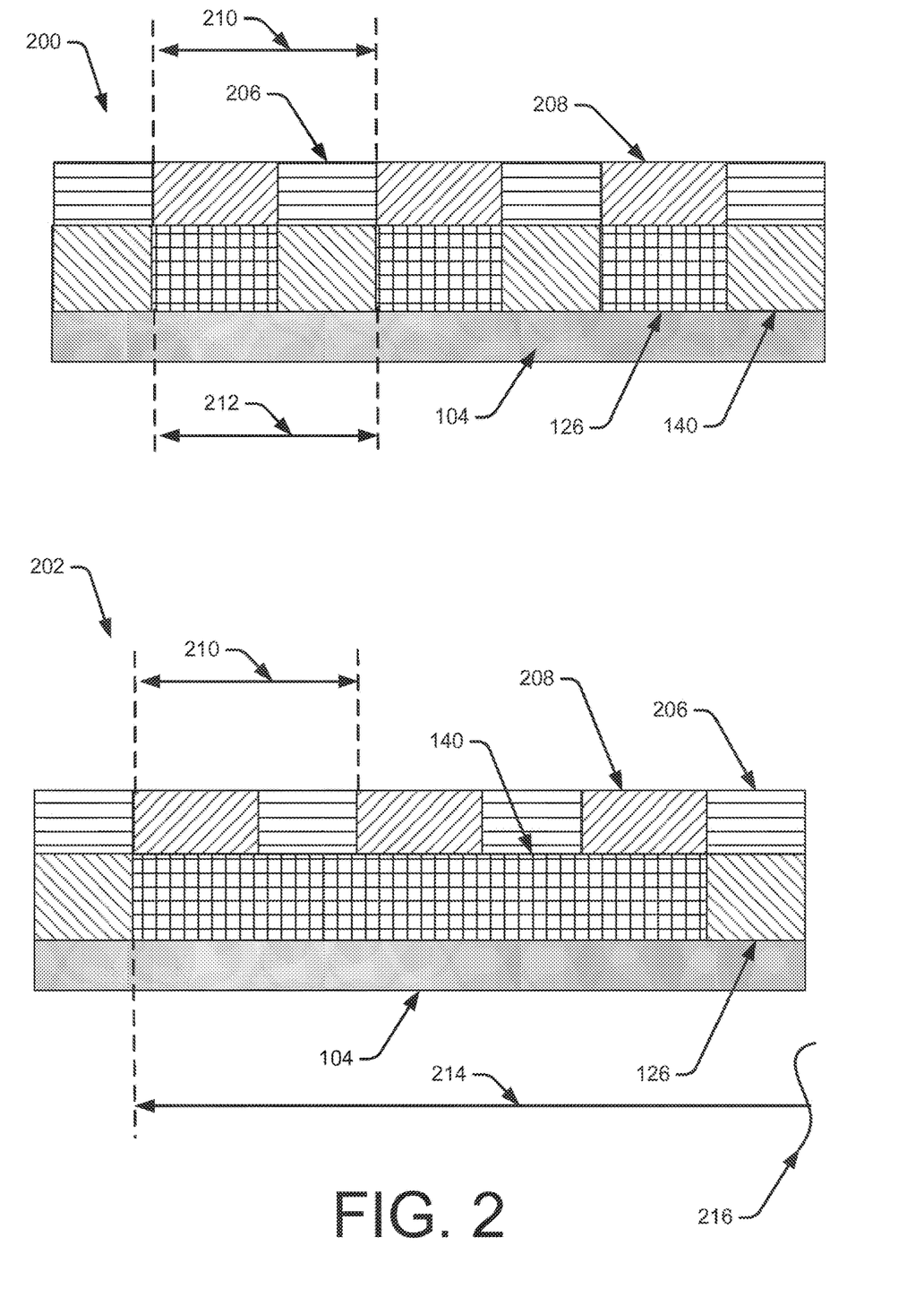
FIG. 2 includes cross-section illustrations of aligned block copolymers that may be formed using, but is not limited to, the method described in the description of FIGS. 1A-1C.

The annealing of the random copolymer layer 142 may facilitate the self-assembly of the block copolymer into a plurality of alternating specie domains aligned side-by-side as shown in the embodiments illustrated in FIG. 2.

In other embodiments, the DSA template may be formed using a variety of process flows that are different than the process flow illustrated in FIGS. 1A-1C. The scope of this disclosure may not be limited to the FIGS. 1A-1C flow where the guide stripe (e.g., organic polymer 126) is deposited and patterned, and the neutral layer (e.g., neutral copolymer layer 140) is backfilled. In one specific embodiment, the neutral layer may be deposited and patterned with a trench line, and the guide material may be back-filled into the trench. In this way, the first layer deposited may be neutral in contrast to the PS layer of the FIGS. 1A-1C embodiment and the backfill layer may act as the guiding layer instead of being neutral. The patterning of the neutral layer may include an etch and organic strip that may be similar to the process in FIG. 1A-1C. For example, the substrate 104 may be coated with a neutral layer that may be patterned and etched, and the trench may be backfilled by a Poly(styrene) based brush material, baked and rinsed, just as depicted in the illustration opposite block 122 in FIG. 1C. Such processing will yield the same chemical template used to direct the self-assembly of the block copolymer (i.e., FIG. 1C, block 122), but will do so through a different set of processing steps. The residual layer may be formed on the PS layer during the etch process. Accordingly, the residual layer may be removed using UV processing described above.

FIG. 2 illustrates a 1× frequency embodiment 200 of the block copolymer layer and a 3× frequency embodiment 202 of the block copolymer layer that may be implemented, at least in part, by the annealing of the random copolymer layer 142. However, the frequency of the alternating species may not be limited to 1× and 3× and may include any frequency between 1× and 10× or more. The annealing may result in a self-assembly of alternating species (e.g., polystyrene 206 and PMMA 208) that in a side-by-side manner and opposite the organic layer 126 and the neutral copolymer layer 140. The domain size (Lo) 210 may be represented by the one iteration of the width of each species that may be adjacent to each other. The Lo pattern may be repeated across the substrate to form an array of lines and spaces that may be parallel to each other. Similarly, the underlying organic layer 126 and the neutral copolymer layer 140 may vary within a period distance 212 in which the two species alternate as shown in FIG. 2. The placement of polystyrene domain 206 and the PMMA domain 208 may vary with the structure of the underlying layer and may repeat at a certain frequency between the organic layer 126 and the neutral copolymer layer 140. FIG. 2 merely includes two representative embodiments that use different pattern frequencies.

In the 1× frequency embodiment 200, the alternating species may correlate with the corresponding underlying layers in a one-to-one manner, such that the polystyrene blocks 206 may be opposite one of the neutral copolymer layer 140 blocks. The polystyrene blocks 206 and the PMMA blocks 208 may be parallel or substantially parallel to each other. The degree of quality of the formation of the DSA template may be measured based on how parallel the lines and/or space may be over a surface area.

In one embodiment, the parallel lines/spaces may be at least 95% parallel or substantially parallel over a region with a surface area of at least 1 µm². In one specific embodiment, the surface area may be 1.2656 µm². In another embodiment, the quality of the parallel lines/spaces may be at least 95% parallel over a surface area that may include an array of at least 40 lines/spaces over a surface area that may include more than a majority of the array. For example, the array surface area may include the entire array except for the surface area that may be within 10 Lo of the array edge or perimeter.

In certain instances, the quality of array may be classified into two or more categories that may segregate the arrays for the purpose of quality control. For example, the arrays may be binned into three categories 95%-100%, 60%-94%, and less than 59%. In one instance, the passing criteria may be 95%-100% to control or qualify the DSA processing scheme. In another instance, the passing criteria may be 60%-100%, in that structures that are less than 59% would not pass in either embodiment.

In other embodiments, the domain size 210 and the period distance 212 may vary from the 1:1 ratio illustrated in the 1× frequency embodiment 200. Accordingly, the overlap of different species may be used to selectively etch different patterns into the substrate 104 or underlying layers than by using the 1× frequency embodiment 200.

In the 3× frequency embodiment 202, the domain size (Lo) 210 may alternate at a higher frequency within the period distance 214, such that the domain size 210 may alternate several times within the given period distance 214. In this embodiment, the period distance 214 may extend further than is illustrated in FIG. 2 as represented by the continuation marker 216. In this instance, the ratio of the overlying and underlying layers may be 3:1. However, in other embodiments, the ratio may be up to 10:1. Additionally, the quality criteria described above in the description of the 1× frequency embodiment 200 may also be used to rate and/or classify the lines/spaces in the overlying layer in the 3× frequency embodiment 202.

Figure 3:
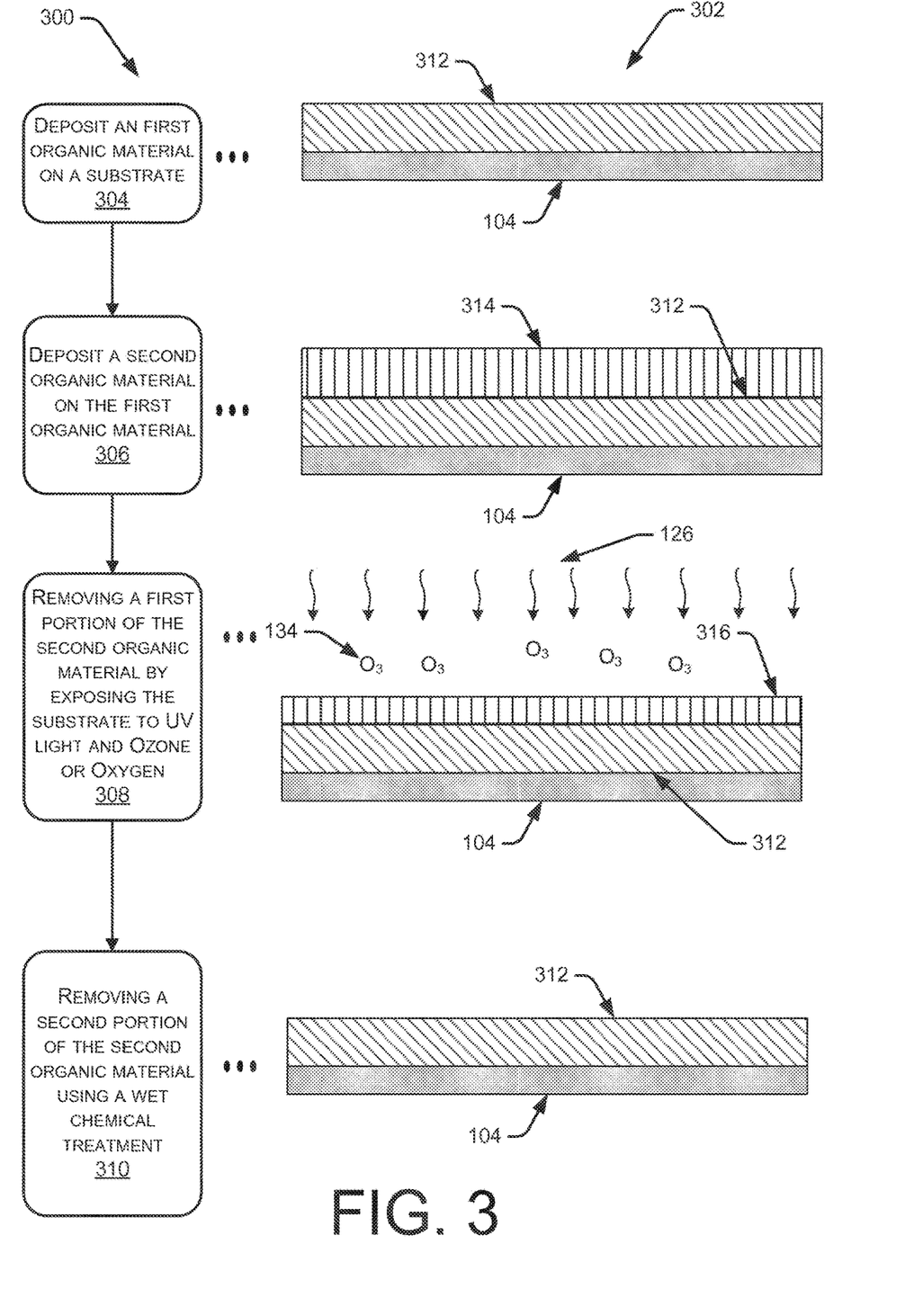
FIG. 3 includes an illustration of a flow diagram with corresponding illustrations for a method to remove a first organic layer disposed above a second organic layer formed on a substrate.

FIG. 3 includes an illustration of a flow diagram 300 with corresponding illustrations 302 for a method to selectively remove a first organic film an underlying second organic film formed on a substrate 104. The removal selectivity may enable a minimal change in thickness or surface state of the underlying organic film.

At block 304, a first organic material 312 may be deposited on the substrate 104 using any known deposition technique that may include, but is not limited to, chemical vapor deposition or spin-on coating. In one embodiment, the first organic layer 312 may be any radiation sensitive composition that chemically reacts when exposed to visible light, deep ultraviolet (DUV) light, extreme ultraviolet (EUV) light, electron beam and X-ray radiant energy are radiation types commonly used today in photolithography processes. When exposed to radiation, the bonds of the molecules in the photoresist layer 128 may break or become more soluble, such that the exposed portion may be dissolved using a photoresist developer chemical. The photoresist may include, but is not limited to, one or more of the following: protected or unprotected methacrylic copolymers, protected or unprotected acrylic comonomers, styrene, hydroxystyrene, or protected or unprotected hydroxystyrene comonomers.

At block 306, a second organic film 314 may be deposited on the first organic layer 312, such the two organic films physically interface with each other and they are relatively distinguishable from each other, despite any similar organic nature of the two films. In one embodiment, the second organic film 314 may be an anti-reflective material that enables the transmission of light into the second organic film 314, but limits the amount of light that may be reflected out from the second organic layer 314.

At block 308, a first portion of the second organic layer 314 may be removed using a combination of UV light 126 and oxygen 126. The first portion may include at least 40% of the thickness of the second organic layer 314, as illustrated different in thickness between by the thinner second organic layer 316 and the second organic layer 312 illustrated in FIG. 3.

In one embodiment, the substrate 104 may be exposed to ultra-violet (UV) light 126 to remove the first portion of the second organic layer 314 and/or to improve the selectivity of any chemistry that may be used to the remainder, or second portion, of the second organic layer 314. The UV light 126 may include electromagnetic radiation that has a wavelength of at least 100 nm. In one embodiment, the UV light 126 may include one or more wavelengths of electromagnetic radiation that may be exposed to the substrate at the same time or in a sequential manner. In one embodiment, a single wavelength of UV light 126 may be used to the treat the substrate 104.

In another embodiment, two different wavelengths of UV light 126 may be used to treat the second organic layer 314. The first wavelength of light may be less than 200 nm and the second wavelength of light may be greater than 200 nm. The UV light 126 may have a dose of up to 150 J/cm2. In another embodiment, the first wavelength of UV light 126 may about 185 nm and the second wavelength of UV light 126 may be about 254 nm.

In another embodiment, the distribution of UV light 126 wavelength may also vary during the exposure process in block 308. For example, the UV light 126 may include at least 10% of the first wavelength with the remainder including UV light 126 of the second wavelength. In one specific embodiment, at least 10% of the UV light 126 may include a wavelength of about 185 nm with the remainder of the UV light 126 having a wavelength of about 254 nm.

In addition to the UV light 126, the exposure process may also include a reactive gas 134 that may weaken the second organic layer 314. The reactive gas may include, but is not limited to, monoatomic oxygen, diatomic oxygen, and/or ozone.

The combination of the UV light 126 and the reactive gas 134 may oxidize and/or weaken the second organic layer 314. The reactive gas 134 may include diatomic oxygen that may be used to generate ozone when the reactive gas 134 is exposed to the UV light 126 or any other energy source. At a minimum, the combination of the UV light 126 and/or the reactive gas 134 may be used to change a surface state of the second organic layer 314. The reactive gas 134 may also make the weakened second organic layer 314 more hydrophilic, such that the weakened second organic layer 316 may be more easily removed in a subsequent wet chemical process.

At block 310, a wet chemical treatment may be used to remove a second portion of the second organic layer 316 such that any changes to the thickness and/or surface state of the first organic layer 312 may be minimal. The wet chemical treatment may include, but is not limited to, the wet chemical treatments described in the description of block 118.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for removing a first organic layer from a substrate, comprising:
   depositing the first organic layer on a second organic layer comprising a photoresist on the substrate;
   removing a first portion of the first organic layer by exposing the first organic layer to ultraviolet light and oxygen, the first portion of the first organic layer being a thickness across an entire surface of the first organic layer; and
   removing a second portion of the first organic layer using a wet chemical process, and
   wherein, following the removal of the first portion, the first organic layer comprises a higher oxygen concentration than the second organic layer.

2. The method of claim 1, wherein the first portion comprises at least 40% of a thickness of the first organic layer and the second portion comprises a remainder of the thickness of the first organic layer.

3. The method of claim 1, wherein the first organic layer comprises an organic anti-reflective material, and the substrate comprises silicon.

4. The method of claim 1, wherein the ultraviolet light comprises a first distribution of wavelengths less than 200 nm and a second distribution of wavelengths greater than 200 nm.

5. The method of claim 4, wherein the wavelength that is less than 200 nm comprises a wavelength no more than 185 nm.

6. The method of claim 5, wherein the wavelength that is greater than 200 nm comprises a wavelength of at least 220 nm.

7. The method of claim 1, wherein the ultraviolet light comprises a wavelength of about 185 nm.

8. The method of claim 7, wherein the wavelength that is greater than 200 nm comprises a wavelength of about 254 nm.

9. The method of claim 1, wherein the ultraviolet light comprises a wavelength greater than 100 nm.

10. A method for removing a first organic layer from a substrate comprising:
    depositing the first organic layer on a layer of photoresist different from the first organic layer such that the first organic layer and the layer of photoresist interface with each other and are distinguishable from each other;
    removing a first portion of the first organic layer by exposing the first organic layer to ultraviolet light and oxygen, the first portion of the first organic layer being a thickness across an entire surface of the first organic layer, wherein following removing the first portion, a second portion of the first organic layer remains on the layer of photoresist; and
    removing the second portion of the first organic layer using a wet chemical process without removing the layer of photoresist, and
    wherein the first portion comprises at least 40% of the thickness of the first organic layer and the second portion comprises a remainder of the thickness of the first organic layer.

11. The method of claim 10, wherein the first organic layer is an anti-reflective material layer, and the substrate is silicon.

12. The method of claim 11, wherein removing the second portion of the anti-reflective material layer includes exposing the layer of photoresist.

13. The method of claim 11, wherein, following the removing the first portion, an oxygen concentration of the remaining anti-reflective material layer is increased relative to an oxygen concentration of the layer of photoresist.

14. The method of claim 10, wherein during removing of the second portion of the first organic layer the wet chemical process includes one or more of ammonium hydroxide, hydrogen peroxide, water, an aqueous solution, semi-aqueous solution, non-aqueous chemical solution, or any combination thereof.

* * * * *

UNITED STATES PATENT AND TRADEMARK OFFICE
CERTIFICATE OF CORRECTION

| | |
|---|---|
| PATENT NO. | : 11,538,684 B2 |
| APPLICATION NO. | : 16/671564 |
| DATED | : December 27, 2022 |
| INVENTOR(S) | : Mark H. Somervell et al. |

It is certified that error appears in the above-identified patent and that said Letters Patent is hereby corrected as shown below:

In the Specification

Column 1, Lines 13-14, "This invention relates to semiconductor processing technology, and more particularly, to methods for directed self" should be --This invention relates to semiconductor processing technology, and, more particularly, to methods for directed self--.

Column 1, Lines 19-20, "that may be used to form the integrated circuits or electronics devices." should be --that may be used to form the integrated circuits for electronics devices.--.

Column 1, Lines 32-33, "Self-assembly of block copolymers (BCP) have been used as a tool for decreasing" should be --Self-assembly of block copolymers (BCP) has been used as a tool for decreasing--.

Column 3, Lines 10-12, "in connection with an embodiment, it is within the knowledge of those skilled in the relevant art(s) to affect such feature," should be --in connection with an embodiment, it is within the knowledge of those skilled in the art(s) to effect such feature,--.

Column 6, Lines 9-12, "Although the method 100 will be described as multiple discrete options for the purpose of explanation. However, the order of description should not be construed as to imply that these operations are necessarily order dependent." should be --The method 100 will be described as multiple discrete options for the purpose of explanation; however, the order of description should not be construed as to imply that these operations are necessarily order dependent.--.

Column 6, Lines 15-16, "The method 100 may be performed in a different order that the described embodiment." should be --The method 100 may be performed in a different order than the described embodiment.--.

Column 6, Lines 64-66, "In another embodiment, the photoresist layer 128 may a negative tone photoresist" should be --In another embodiment, the photoresist layer 128 may be a negative tone photoresist--.

Signed and Sealed this
Sixth Day of June, 2023

Katherine Kelly Vidal
*Director of the United States Patent and Trademark Office*

CERTIFICATE OF CORRECTION (continued)
U.S. Pat. No. 11,538,684 B2

Column 7, Lines 15-17, "photoresist layer 128 that may be have been removed during a chemical and/or plasma processing that are not shown the flow diagram for" should be --photoresist layer 128 that may have been removed during a chemical and/or plasma processing that are not shown the flow diagram for--.

Column 7, Line 34, "patterns provided in previous patterning process" should be --patterns provided in a previous patterning process--.

Column 8, Lines 4-5, "embodiment, the first wavelength of UV light 126 may about 185 nm and the second wavelength of UV light 126 may be" should be --embodiment, the first wavelength of UV light 126 may be about 185 nm and the second wavelength of UV light 126 may be--.

Column 10, Line 18, "300 ppm) for about a 2 minutes to about 5 minutes." should be --300 ppm) for about 2 minutes to about 5 minutes.--.

Column 10, Lines 57-58, "and PMMA 208) that in a side-by-side manner and opposite the organic layer 126" should be --and PMMA 208) in a side-by-side manner and opposite the organic layer 126--.

Column 11, Lines 55-56, "remove a first organic film an underlying second organic film formed on a substrate" should be --remove a first organic film and underlying second organic film formed on a substrate--.

Column 12, Line 11, "on the first organic layer 312, such the" should be --on the first organic layer 312, such that--.

Column 12, Lines 29-30, "any chemistry that may be used to the remainder, or second portion, of the second" should be --any chemistry that may be used for the remainder, or second portion, of the second--.

Column 12, Lines 36-37, "wavelength of UV light 126 may be used to the treat the substrate 104." should be --wavelength of UV light 126 may be used to treat the substrate 104.--.